(12) United States Patent
Saito et al.

(10) Patent No.: US 9,071,217 B1
(45) Date of Patent: Jun. 30, 2015

(54) WIRELESS COMMUNICATION DEVICE

(71) Applicant: Panasonic Corporation, Osaka (JP)

(72) Inventors: Noriaki Saito, Tokyo (JP); Kenji Miyanaga, Kanagawa (JP); Koichiro Tanaka, Hyogo (JP); Takayuki Tsukizawa, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/624,274

(22) Filed: Feb. 17, 2015

(30) Foreign Application Priority Data

Feb. 19, 2014 (JP) ................................. 2014-029799

(51) Int. Cl.
*H04L 25/49* (2006.01)
*H03G 3/30* (2006.01)
*H03F 1/32* (2006.01)

(52) U.S. Cl.
CPC ............ *H03G 3/3047* (2013.01); *H03F 1/3247* (2013.01)

(58) Field of Classification Search
CPC . H03G 3/3047; H03G 3/3042; H04B 1/0475; H04B 10/564; H03F 1/3247; H03F 1/30; H03F 1/3241; H03F 2200/447; H03F 3/24; H04L 27/368
USPC ........................... 375/285, 295, 296, 297, 377
See application file for complete search history.

(56) References Cited

U.S. PATENT DOCUMENTS

| | | | |
|---|---|---|---|
| 5,369,789 A | 11/1994 | Kosugi et al. | |
| 5,371,473 A * | 12/1994 | Trinh et al. | ................... 330/129 |
| 6,369,739 B1 * | 4/2002 | Inada et al. | ................... 341/155 |
| 8,755,757 B2 * | 6/2014 | Yamamoto | ................ 455/114.3 |
| 2007/0042736 A1 * | 2/2007 | Tateno et al. | ............... 455/234.1 |

FOREIGN PATENT DOCUMENTS

| | | |
|---|---|---|
| JP | 5-095295 | 4/1993 |
| JP | 9-260720 | 10/1997 |
| JP | 11-004132 | 1/1999 |
| JP | 2011-040880 | 2/2011 |

* cited by examiner

*Primary Examiner* — Tesfaldet Bocure
(74) *Attorney, Agent, or Firm* — Panasonic Patent Center

(57) ABSTRACT

A wireless communication device includes a digital modulation signal generator that generates digital modulation signals, a DAC that converts digital output of the digital modulation signal generator into analog signals, a modulator that generates amplified quadrature modulation signals by exerting quadrature modulation and amplification on the analog signals, an antenna that radiates the amplified quadrature modulation signals, a power detector that outputs power detected signals obtained from power detection of the amplified quadrature modulation signals, a controller that adjusts gain of the modulator by using the power detected signals and a desired power value, a thermometer that measures ambient temperatures at a plurality of burst transmission periods, and a high-power prevention circuit that readjusts the gain of the modulator for a present burst transmission period.

7 Claims, 10 Drawing Sheets

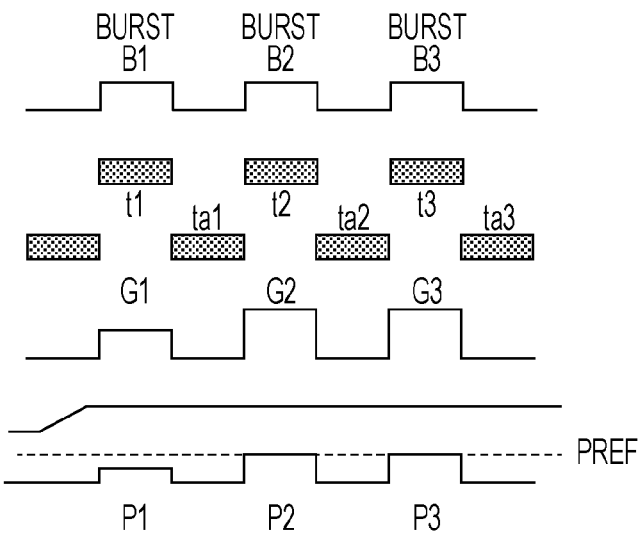
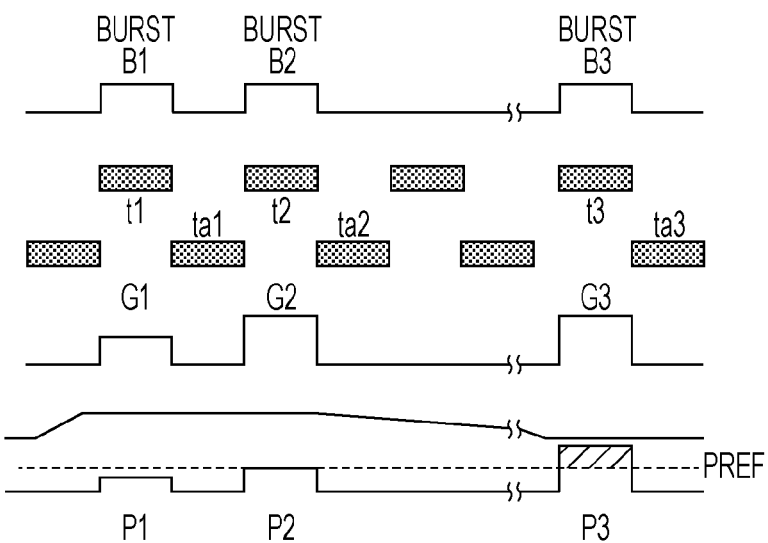

WIRELESS COMMUNICATION DEVICE

CROSS REFERENCES TO RELATED APPLICATIONS

This application claims priority to Japanese Patent Application No. 2014-029799, filed on Feb. 19, 2014, the contents of which are hereby incorporated by reference.

BACKGROUND

1. Technical Field

The present disclosure relates to a wireless communication device that enables control over transmission output.

2. Description of the Related Art

In recent years, integrated circuits for millimeter wave communication using the 60 GHz band have been put into practical use, with the miniaturization of CMOS processes. In millimeter wave communication using the 60 GHz band, an increase in circuit operating frequency causes a decrease in a difference between the circuit operating frequency and upper cutoff frequency ft (frequency that provides a current gain of one) in CMOS processes which is ensured in microwave band designations and causes an increase in the fluctuation range of the output level of an amplifier that results from variation in the process and temperature change. In data communication, in which time-division high speed burst signals are used, the output level for each burst is desired to be made constant and a gain change in a burst signal causes amplitude fluctuation.

An example of the related technique is described in Japanese Unexamined Patent Application Publication No. 11-004132. In the technique, transmission power is detected from a transmit level of each burst signal at a predetermined time point, error between the detected transmission power and a desired output level is calculated, and the result of the calculation is not reflected in the present burst signal but in a subsequent burst signal.

SUMMARY

The technique described in Japanese Unexamined Patent Application Publication No. 11-004132, however, has a problem in that transmission output of the subsequent burst signal may exceed the desired output value on condition that a burst signal interval is increased depending on communication situation and that an ambient temperature at a period of the reflection of a gain is greatly decreased in comparison with that at the period of the detection of the transmission output.

One non-limiting and exemplary embodiment provides a wireless communication device that is capable of curbing the excess of the transmission output over the desired output value so as to make the transmission output constant on condition that the burst signal interval is greatly increased and that the ambient temperature is decreased before the subsequent burst signal is transmitted.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature the wireless communication device of the disclosure including a digital modulation signal generator that generates digital modulation signals, a DAC that converts the digital modulation signals into analog signals, a modulator that generates amplified quadrature modulation signals by exerting quadrature modulation and amplification on the analog signals, an antenna that radiates the amplified quadrature modulation signals, a power detector that outputs power detected signals obtained from power detection of the amplified quadrature modulation signals, a controller that adjusts gain of the modulator by using the power detected signals and a desired power value, a thermometer that measures ambient temperatures at a plurality of burst transmission periods, and a high-power prevention circuit that readjusts the gain of the modulator for a present burst transmission period by using the ambient temperature at a past burst transmission period, the ambient temperature at the present burst transmission period, a predetermined temperature difference threshold, and the adjusted gain of the modulator.

These general and specific aspects may be implemented using a system, a method, and a computer program, and any combination of systems, method, and computer programs.

According to the disclosure, the excess of the transmission output over the desired output value can be curbed and the transmission output can be made constant on condition that the burst signal interval is greatly increased and that the ambient temperature is decreased before the subsequent burst signal is transmitted.

BRIEF DESCRIPTION OF THE DRAWINGS

FIGS. 10A to 10F are time charts illustrating operations of the wireless communication device of FIG. 9 in a state with no decrease in ambient temperature; and FIGS. 11A to 11F are time charts illustrating operations of the wireless communication device of FIG. 9 in a state with decrease in the ambient temperature.

DETAILED DESCRIPTION

Hereinbelow, embodiments of the disclosure will be described with reference to the drawings.

Figure 9:
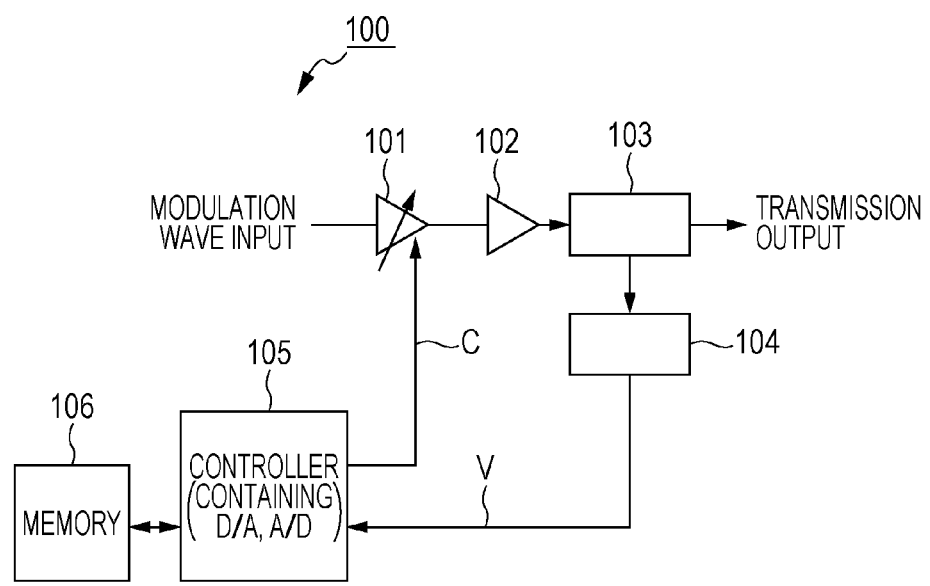
FIG. 9 is a block diagram illustrating a schematic configuration of a wireless communication device that is described in Japanese Unexamined Patent Application Publication No. 11-004132 and that has a transmission output control function.

Underlying Knowledge of Forming Basis of One Embodiment of the Present Disclosure FIG. 9 is a block diagram illustrating a schematic configuration of a wireless communication device that is described in Japanese Unexamined Patent Application Publication No. 11-004132 and that has a transmission output control function. The wireless communication device 100 illustrated in FIG. 9 includes an amplifier 101 of which amplification factor may be adjusted, a power amplifier 102, a coupler 103, a power detector 104, a controller 105, and a memory 106. Inputted modulation wave signals are amplified in the amplifier 101 and the power amplifier 102 and are thereafter outputted from the coupler 103. Using a voltage V indicating transmission power detected by the power detector 104 as an input, the controller 105 controls the amplification factor of the amplifier 101 in order to keep the transmission power at a desired value (Pref).

FIGS. 10A to 10F are time charts illustrating operations of the wireless communication device of FIG. 9 in a state with no decrease in ambient temperature. FIGS. 11A to 11F are time charts illustrating operations of the wireless communication device of FIG. 9 in a state with decrease in the ambient temperature. FIGS. 10A to 10F and 11A to 11F are the time charts with the fixed ambient temperature. FIGS. 10A to 10F and 11A to 11F are the time charts for transmission burst signal (FIGS. 10A and 11A), detection timing for the transmission output (FIGS. 10B and 11B), correction section (FIGS. 10C and 11C), transmission gain (FIGS. 10D and 11D), ambient temperature (FIGS. 10E and 11E), and transmission output (FIGS. 10F and 11F).

The detection timing for the transmission output by the controller 105 is set at points (t1 through t3) in vicinity of centers of periodically outputted burst signals (burst signals B1, B2, and B3, for instance). The controller 105 detects the transmission output (P1) for the burst signal B1 at the period (t1) and thereafter performs amplification factor correcting calculation for the amplifier 101 and for adjustment in the transmission output in a term before transmission of the subsequent burst signal when no burst signal is transmitted, that is, the correction section (ta1). Before the subsequent burst signal B2 is started, result of the calculation is preliminarily reflected in the amplification factor of the burst signal B2.

In FIGS. 10A to 10F, the transmission output (P1) is lower than the desired value (PREF) and thus the amplification factor of the amplifier 101 in the subsequent burst signal B2 is increased so that the transmission output (P2) is increased. That is, the control over the amplification factor of the amplifier 101 in accordance with the transmission output curbs amplitude fluctuation in the subsequent burst signal and enables stable transmission output.

The technique described in Japanese Unexamined Patent Application Publication No. 11-004132 assumes mild change in the ambient temperature and thus causes no problem as long as the burst signal interval illustrated in FIG. 10A is short. In FIGS. 11A to 11F, however, interval between the burst signals B2 and B3 is longer than interval between the burst signals B1 and B2, and the ambient temperature is greatly decreased at the period (t3) of the reflection of the gain in comparison with the detection period (t2) of the transmission output.

The technique causes a problem in that the transmission output (P3) of the burst signal B3 exceeds the desired value (PREF) because the amplification factor of the amplifier 101 in the burst signal B3 is set in accordance with the burst signal B2. That is, the transmission output exceeds the desired value (PREF) on conditions of the increase in the burst signal interval and the great decrease in the ambient temperature in a correction section.

Hereinbelow, description will be given on wireless communication devices in which transmission output is prevented from greatly exceeding a desired output value so that the transmission output may be made constant even though burst signal interval is greatly increased and that ambient temperature is greatly decreased in correction section (term when no burst signal is transmitted).

Making the transmission output constant (auto power control (APC)) means an operation of adjusting gain of an amplifier for making final output constant except for transient fluctuation.

Embodiment 1

Figure 1:
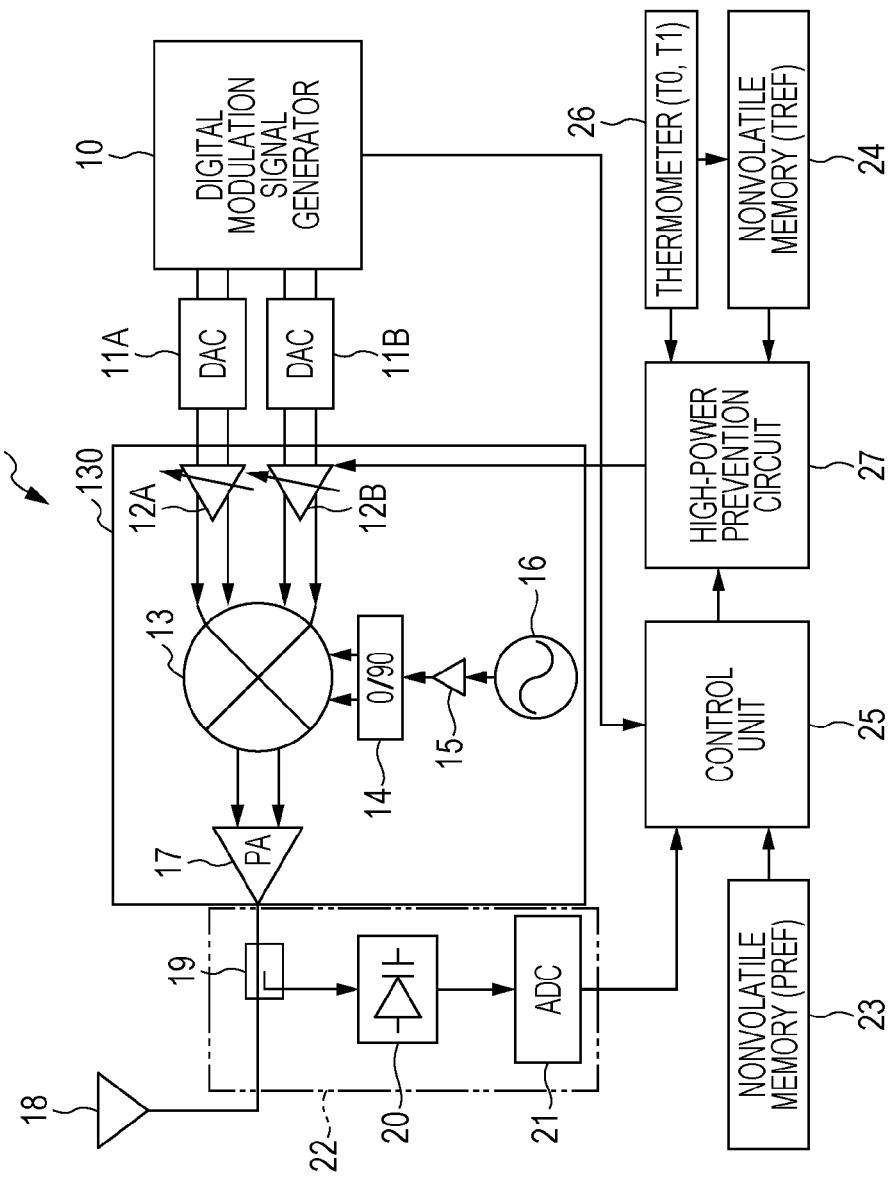
FIG. 1 is a block diagram illustrating a schematic configuration of a wireless communication device according to embodiment 1.

FIG. 1 is a block diagram illustrating a schematic configuration of a wireless communication device according to embodiment 1. In FIG. 1, the wireless communication device 1 according to embodiment 1 includes a digital modulation signal generator 10 that generates digital output of I signal and Q signal, digital to analog converters (DAC) 11A, 11B that convert the digital output of the digital modulation signal generator 10 into analog signals, a quadrature modulation unit 130 that exerts quadrature modulation and amplification on output of the DACs 11A, 11B, a transmission antenna (antenna) 18 that radiates transmit signals amplified by the quadrature modulation unit 130, a power detection unit 22 that fetches and detects a portion of output of the quadrature modulation unit 130 and outputs digitized signals, a nonvolatile memory (first memory) 23 that is used for storage of a desired power value (PREF), a nonvolatile memory (second memory) 24 that is used for storage of a predetermined temperature difference threshold (TREF), a control unit 25 that adjusts gain of the quadrature modulation unit 130 by using output of an ADC 21 and output of the nonvolatile memory 23 as input, and a high-power prevention circuit 27 into which output of the control unit 25, a thermometer 26, and the nonvolatile memory 24 is inputted.

The quadrature modulation unit 130 includes variable gain amplifiers 12A, 12B that amplify the output of the DACs 11A, 11B by using gain variable in external control, a quadrature modulator 13 that exerts quadrature modulation on output of the variable gain amplifiers 12A, 12B, and a high-power amplifier 17 that amplifies output of the quadrature modulator 13.

The power detection unit 22 includes a coupler 19 that fetches the portion of the output of the quadrature modulation unit 130, a detector 20 that detects the output of the quadrature modulation unit 130 fetched by the coupler 19, and the analog to digital converter (ADC) 21 that digitizes output of the detector 20.

The adjusted gain value is inputted from the high-power prevention circuit 27 into the variable gain amplifiers 12A, 12B.

The quadrature modulator 13 exerts the quadrature modulation on the output of the variable gain amplifiers 12A, 12B by using a local (LO) amplifier 15 that varies level of local (LO) signal oscillated by an oscillator 16 and a 90 degrees phase shifter 14 that shifts phase of the LO signal 90 degrees.

Though the nonvolatile memories 23 and 24 are illustrated as separate configurations in FIG. 1, the nonvolatile memories 23 and 24 may be configured by using one memory.

Subsequently, operations of the wireless communication device 1 according to embodiment 1 will be described.

Figure 2:
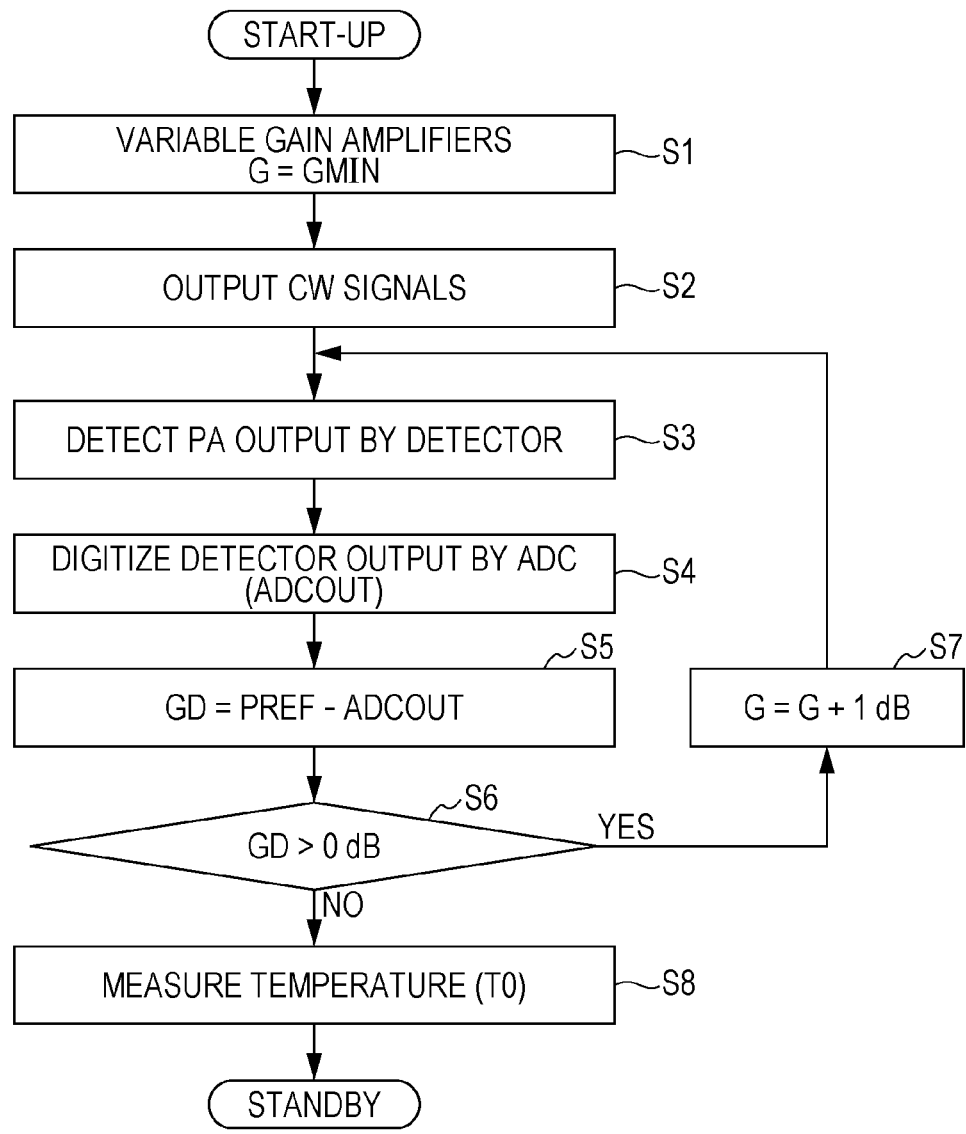
FIG. 2 is a flow chart illustrating automatic gain control processing upon start-up of the wireless communication device according to embodiment 1.

FIG. 2 is a flow chart illustrating automatic gain control processing upon start-up of the wireless communication device 1 according to embodiment 1. In FIG. 2, the wireless communication device 1 is started and the high-power prevention circuit 27 thereafter sets gain G of the variable gain amplifiers 12A, 12B at minimum value (GMIN), stored in advance, in pursuant to instructions from the control unit 25 (step S1). After the gain G of the variable gain amplifiers 12A, 12B is set at the minimum value, the digital modulation signal generator 10 outputs continuous-wave signals (CW signals) for testing (step S2).

The CW signals outputted from the digital modulation signal generator 10 undergo analog conversion in the DACs 11A, 11B and are thereafter amplified in the variable gain amplifiers 12A, 12B. After that, the CW signals are modulated in the quadrature modulator 13 and are outputted as modulation wave signals. The outputted modulation wave signals are amplified in the high-power amplifier 17 and are radiated from the transmit antenna 18.

The modulation wave signals amplified in the high-power amplifier 17 are detected in the detector 20 (step S3). The detector output is digitized in the ADC 21 and is outputted as ADCOUT (output level) (step S4).

The ADCOUT outputted from the ADC 21 is captured into the control unit 25. The control unit 25 reads out PREF, stored in the nonvolatile memory 23, by capturing ADCOUT, subtracts value of ADCOUT from PREF having been read out, and calculates subtraction result GD (step S5).

Subsequently, the control unit 25 determines whether GD is greater or not than 0 dB (step S6). When GD is greater than 0 dB (that is, "YES"), the control unit 25 increases the gain G by 1 dB (step S7). Processing of steps S3 through S7 is iterated while GD is greater than 0 dB. When GD is equal to or less than 0 dB (that is, "NO"), the adjusted gain G is outputted to the high-power prevention circuit 27 through the control unit 25.

Subsequently, temperature measurement is carried out by the thermometer 26 and result (TO) of the temperature measurement is stored (step S8). After processing of step S8 is carried out, the processing is ended and standby state is brought about.

Figure 3:
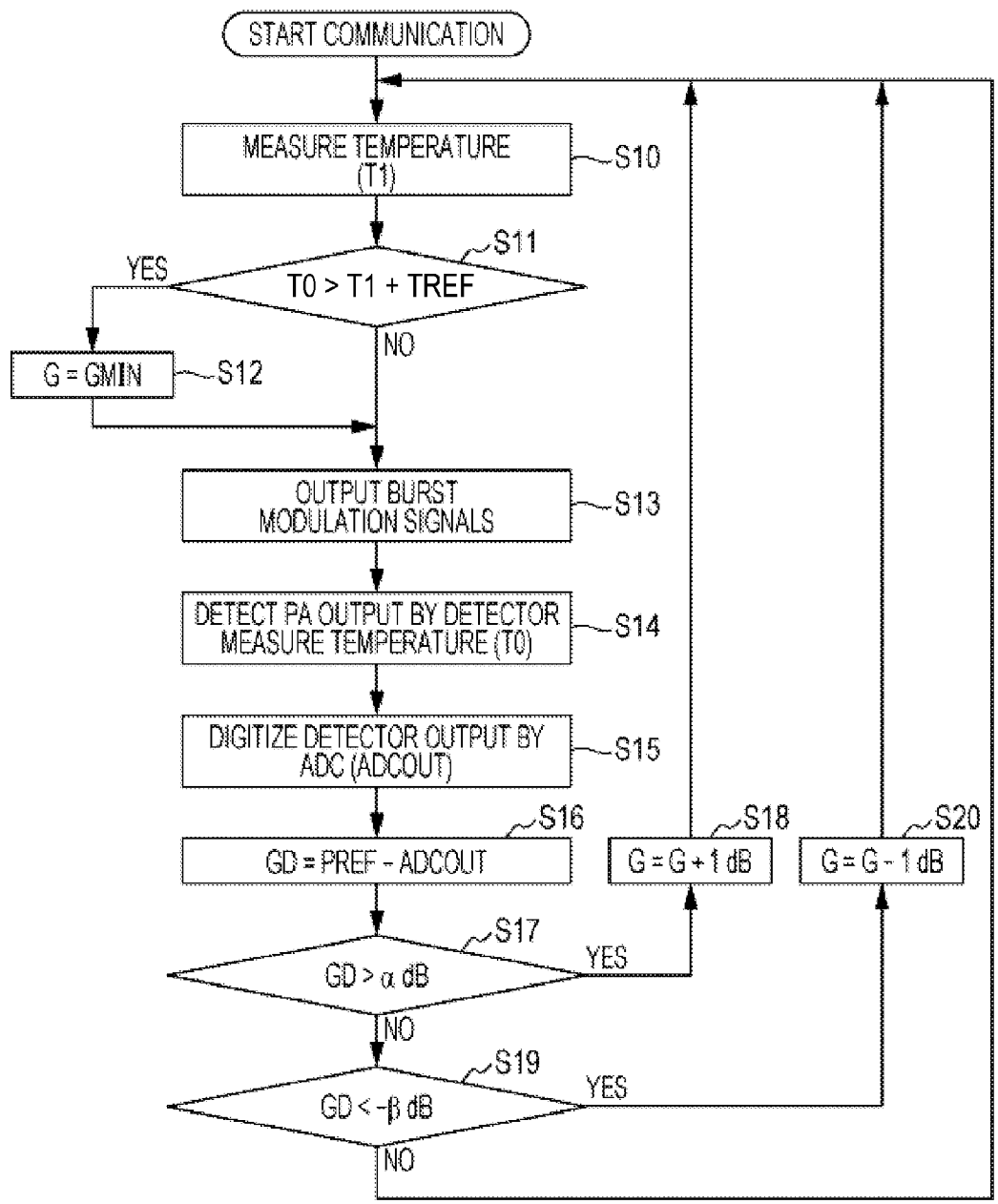
FIG. 3 is a flow chart illustrating automatic gain control processing during communication to and from the wireless communication device according to embodiment 1.

FIG. 3 is a flow chart illustrating automatic gain control processing during communication to and from the wireless communication device 1 according to embodiment 1. In FIG. 3, initially, temperature measurement is carried out by the thermometer 26 and result (T1) of the temperature measurement is stored (step S10). The measured temperature T1 is outputted to the high-power prevention circuit 27.

The high-power prevention circuit 27 uses result of addition of TREF, stored in the nonvolatile memory 24, from the measured temperature T1 (step S10) and thereby readjusts the gain G adjusted in the control unit 25. The high-power prevention circuit 27 determines whether the temperature TO recorded upon the detection is greater or not than the addition result (T1+TREF) (step S11). When the temperature TO recorded upon the detection is greater than the addition result (T1+TREF) (that is, "YES"), the gain G of the variable gain amplifiers 12A, 12B that has been adjusted upon the previous burst period by the control unit 25 is set at the minimum value (GMIN) (step S12). When the temperature TO recorded upon the detection is equal to or less than the addition result (T1+TREF) (that is, "NO"), the variable gain amplifiers 12A, 12B omit the readjustment of the gain G and maintain the present value (gain adjusted upon the previous burst period by the control unit 25) (step S11).

After measuring the temperature and setting the gain of the variable gain amplifiers 12A, 12B at the minimum value or the present value, the digital modulation signal generator 10 outputs burst modulation signals (step S13). The burst modulation signals outputted from the digital modulation signal generator 10 are digitized in the DACs 11A, 11B and are thereafter amplified by the variable gain amplifiers 12A, 12B by using the gain G that has been set.

Subsequently, the amplified signals are modulated in the quadrature modulator 13 and are thereafter amplified and outputted to the transmit antenna 18 by the high-power amplifier 17. The coupler 19 fetches a portion of the output of the high-power amplifier 17, for output to the detector 20. The detector 20 detects the signals from the coupler 19. The thermometer 26 measures the temperature (TO) (step S14).

The detector output from the detector 20 is digitized in the ADC 21 and is outputted as ADCOUT (step S15). The control unit 25 reads out PREF stored in the nonvolatile memory 23, upon input of ADCOUT, subtracts ADCOUT from PREF, and calculates the result GD of the subtraction (step S16).

Subsequently, the control unit 25 determines whether GD is greater or not than $\alpha$ dB (step S17). When GD is greater than $\alpha$ dB (that is, "YES"), the control unit 25 increases the gain G by 1 dB (step S18). When GD is equal to or less than $\alpha$ dB (that is, "NO"), the control unit 25 determines whether GD is less than $-\beta$ dB (step S19). When GD is less than $-\beta$ dB (that is, "YES"), the gain G is decreased by 1 dB (step S20).

While GD is greater than $\alpha$ dB, the wireless communication device 1 iterates processing of steps S10 through S18 and increment of 1 dB in the gain G. While GD is equal to or less than $\alpha$ dB and is less than $-\beta$ dB, the wireless communication device 1 iterates processing of steps S10 through S17, S19, and S20 and decrement of 1 dB in the gain G. While communication is continued, operations continue in accordance with the flow chart illustrated in FIG. 3.

Figure 4:
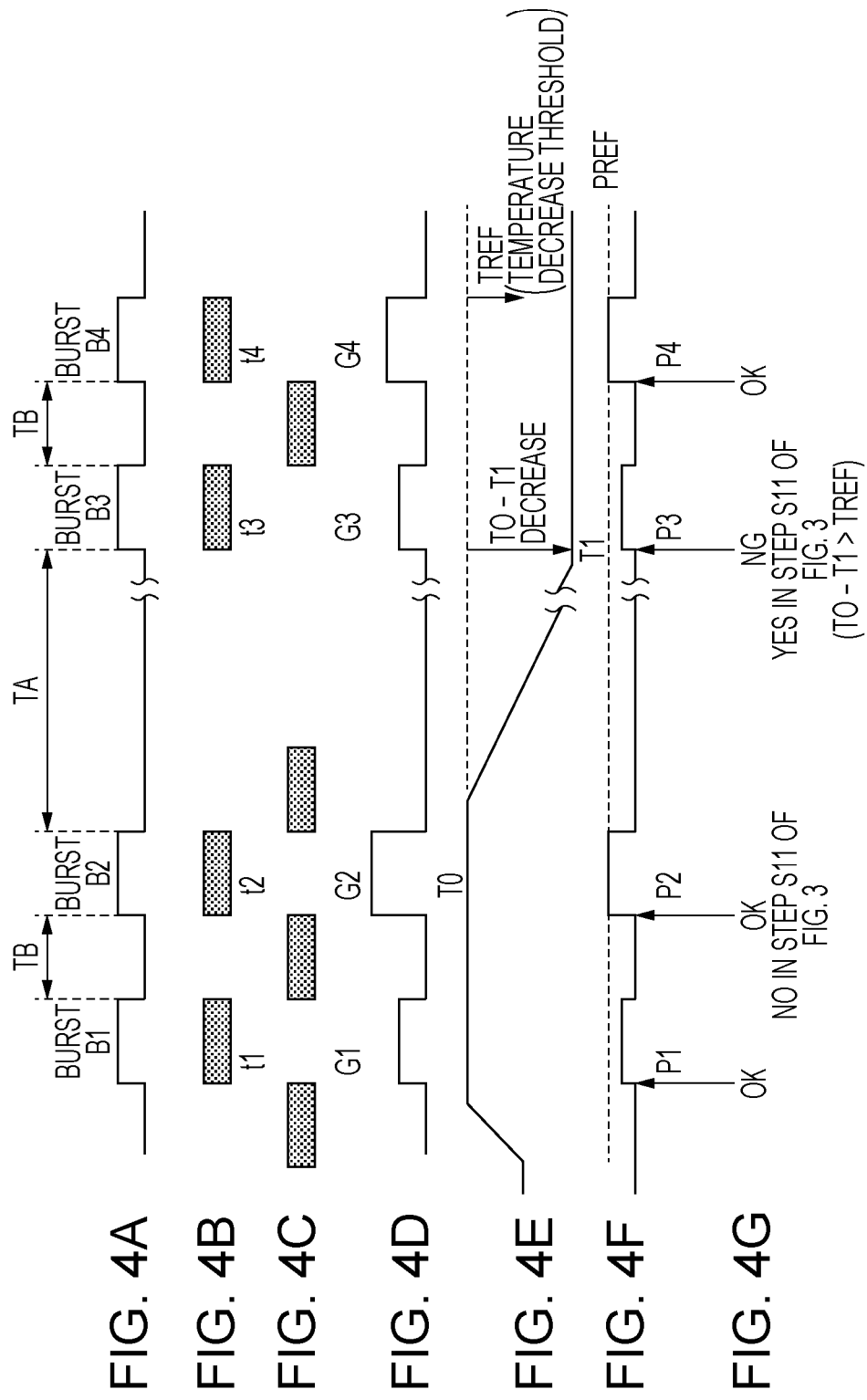
FIGS. 4A to 4G are time charts illustrating the automatic gain control processing during the communication to and from the wireless communication device according to embodiment 1.

FIGS. 4A to 4G are time charts illustrating the automatic gain control processing during the communication to and from the wireless communication device 1 according to embodiment 1. FIGS. 4A to 4G are the time charts for the transmission burst (FIG. 4A), the detection timing for the transmission output (FIG. 4B), the correction section (FIG. 4C), the transmission gain (FIG. 4D), the ambient temperature (FIG. 4E), the transmission output (FIG. 4F), and determination for high-power prevention (FIG. 4G). The determination for the high-power prevention is carried out in the high-power prevention circuit 27.

The wireless communication device 1 according to embodiment 1 operates as in the time charts illustrated in FIGS. 4A to 4G on condition that period TA from end of the burst signal B2 to start of the burst signal B3 is longer than period TB between other burst signals and that the ambient temperature decreases within the period TA.

In a conventional wireless communication device in a state of FIGS. 4A to 4G, the transmission output P3 of the burst signal B3 exceeds PREF with use for the burst signal B3 of the gain G2 of the variable gain amplifiers 12A, 12B found from result of detection of the burst signal B2, as in the related art of FIGS. 11A to 11F.

In the wireless communication device 1 according to embodiment 1, the high-power prevention circuit 27 detects that temperature decrease (T0-T1) from period of the previous detection is greater than TREF ("YES" in step S11), before determining final gain for the burst signal B3, determines "NG", and sets the gain G at the minimum value (step S12). In FIGS. 4A to 4G, gain G3 smaller than the gain G2 is set up for the burst signal B3.

Thus the transmission output P3 of the burst signal B3 is decreased so as not to exceed PREF. Though the transmission output P3 of the burst signal B3 is transiently decreased, it is made afresh possible to adjust the gain for the burst signal B4 or later. That is, the decreased transmission output P3 makes the high-power prevention circuit 27 determine "NG" and the adjustment in the gain is carried out afresh for the burst signal B4 or later burst signals.

Before determination of final gain for the burst signal B2, it is detected that the temperature decrease (T0−T1) from the period of the previous detection is equal to or less than TREF ("NO" in step S11), "OK" is determined, and the change in the gain G is omitted.

In the wireless communication device 1 according to embodiment 1, including the thermometer 26 which measures and stores the ambient temperature, the nonvolatile memory 24 stored with TREF, and the high-power prevention circuit 27 into which output of the thermometer 26 and output of the nonvolatile memory 24 are inputted as input values, the high-power prevention circuit 27 carries out output level control with decrease in setting of the gain to the minimum value when the present temperature is lower than a temperature resulting from decrease by TREF from the temperature at the period of the detection of the power. Therefore, the transmission output is prevented from greatly exceeding PREF so that the transmission output may be made constant even though the burst signal interval is greatly increased and that the ambient temperature is greatly decreased in a correction section.

That is, the wireless communication device 1 is capable of removing transient fluctuation (P3 in FIG. 4F) and making the final output (P4 or later in FIG. 4F) constant by the auto power control (APC).

Embodiment 2

Figure 5:
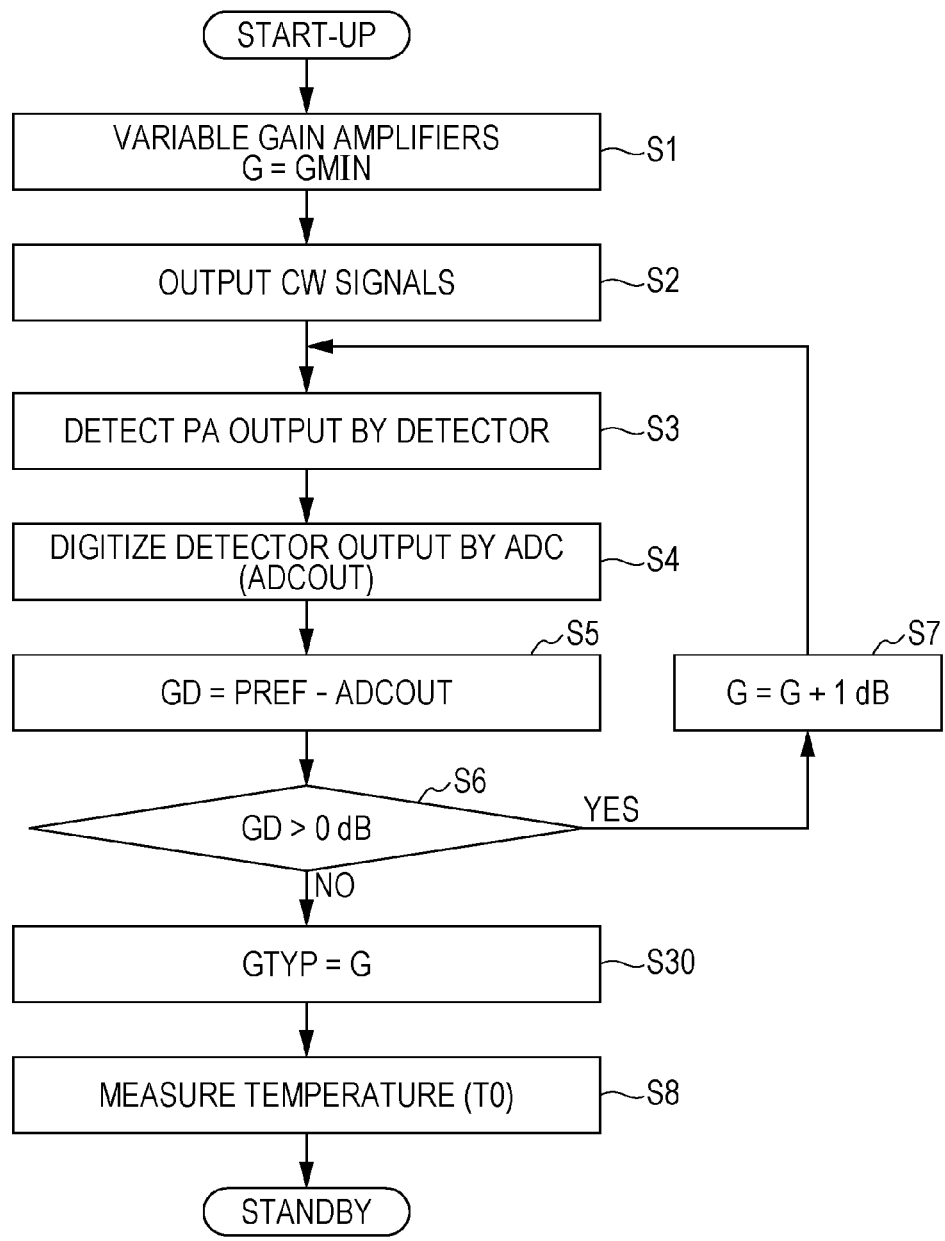
FIG. 5 is a flow chart illustrating automatic gain control processing upon start-up of a wireless communication device according to embodiment 2.
Figure 6:
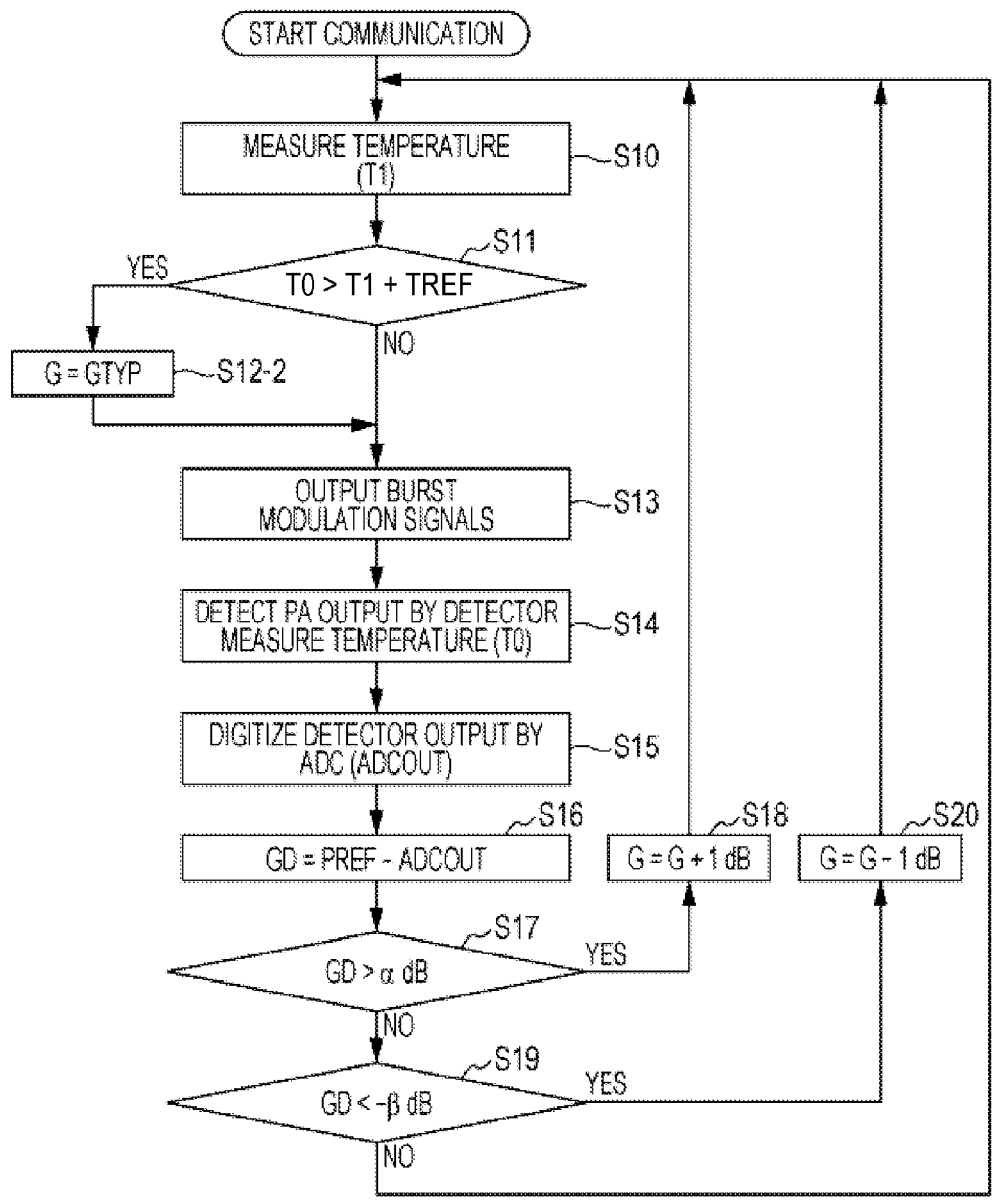
FIG. 6 is a flow chart illustrating automatic gain control processing during communication to and from the wireless communication device according to embodiment 2.

FIG. 5 is a flow chart illustrating automatic gain control processing upon start-up of a wireless communication device according to embodiment 2. FIG. 6 is a flow chart illustrating automatic gain control processing during communication to and from the wireless communication device according to embodiment 2. Configuration of the wireless communication device according to embodiment 2 is similar to configuration of the wireless communication device according to embodiment 1 described above and thus FIG. 1 is invoked for the wireless communication device 2 according to embodiment 2.

In the wireless communication device 1 according to embodiment 1, the gain G of the variable gain amplifiers 12A, 12B is set at the minimum value when the temperature decrease is greater than TREF. In the wireless communication device 2 according to embodiment 2, as illustrated in the flow chart of FIG. 5, step S30 that makes GTYP=G hold is added between step S6 and step S8, so that the gain determined by the automatic gain control upon the start-up is set to be GTYP and outputted to the high-power prevention circuit 27. GTYP may be stored in either the control unit 25 or the high-power prevention circuit 27.

In the flow chart of FIG. 6, for the wireless communication device 2, step S30 is added between step S6 and step S8 in the flow chart of FIG. 5, so that the high-power prevention circuit 27 may set G=GTYP in step S12-2 instead of making the minimum setting MIN of G. Thus the wireless communication device 2 is capable of increasing speed of the automatic gain control by setting the gain, determined by the automatic gain control upon the start-up, to be GTYP and outputting the gain to the high-power prevention circuit 27.

Embodiment 3

Figure 7:
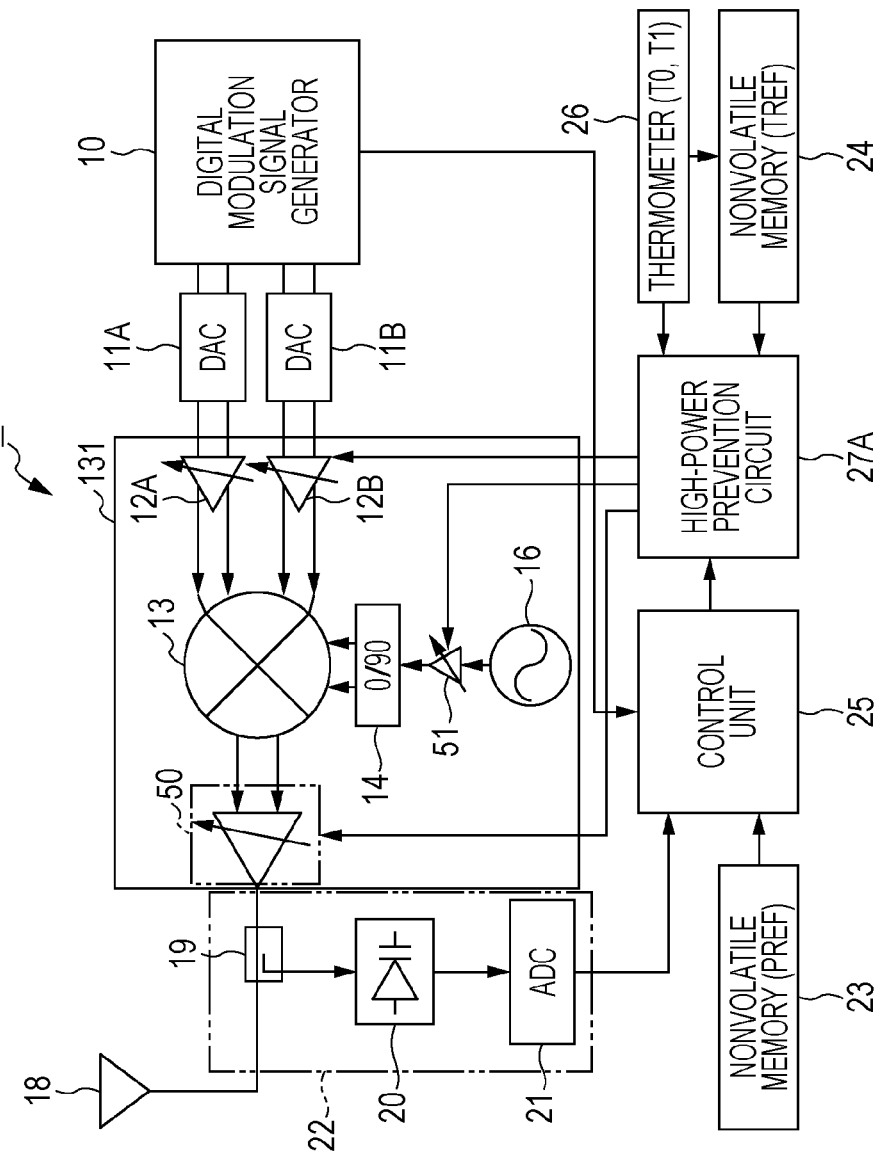
FIG. 7 is a block diagram illustrating a schematic configuration of a wireless communication device according to embodiment 3.

FIG. 7 is a block diagram illustrating a schematic configuration of a wireless communication device according to embodiment 3. In reference to FIG. 7, the wireless communication device 3 according to embodiment 3 includes a variable gain high-power amplifier 50, in place of the high-power amplifier 17 of the wireless communication device 1 according to embodiment 1 described above, a variable gain LO amplifier 51, in place of the LO amplifier 15, and a high-power prevention circuit 27A, in place of the high-power prevention circuit 27.

Though the wireless communication device 1 according to embodiment 1 controls the gain of the variable gain amplifiers 12A, 12B, the wireless communication device 3 according to embodiment 3, which has the variable gain high-power amplifier 50 substituted for the high-power amplifier 17, the variable gain LO amplifier 51 substituted for the LO amplifier 15, and the high-power prevention circuit 27A substituted for the high-power prevention circuit 27, controls gains of the variable gain high-power amplifier 50 and the variable gain LO amplifier 51.

The gain control may be carried out for at least one or a combination of two or more of the variable gain amplifiers 12A, 12B, the variable gain high-power amplifier 50, and the variable gain LO amplifier 51. The configuration of the wireless communication device 3 according to embodiment 3 enables improvement in accuracy of the automatic gain control.

A quadrature modulation unit 131 includes the variable gain amplifiers 12A, 12B, the quadrature modulator 13, the variable gain high-power amplifier 50, and the variable gain LO amplifier 51.

Embodiment 4

Figure 8:
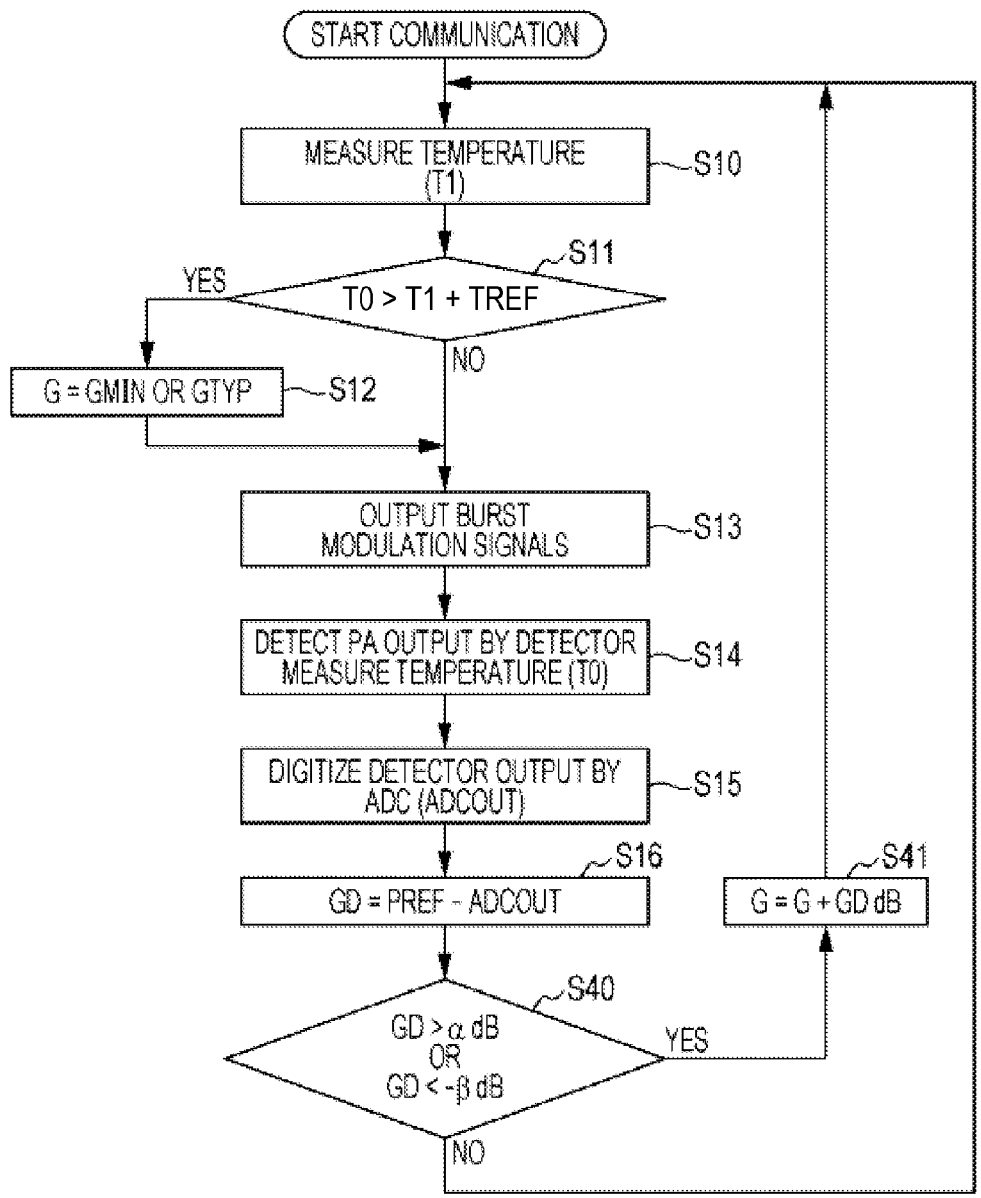
FIG. 8 is a flow chart illustrating automatic gain control processing during communication to and from a wireless communication device according to embodiment 4.

FIG. 8 is a flow chart illustrating automatic gain control processing during communication to and from a wireless communication device according to embodiment 4. Configuration of the wireless communication device according to embodiment 4 is similar to the configuration of the wireless communication device according to embodiment 1 described above and thus FIG. 1 is invoked for the wireless communication device 4 according to embodiment 4.

Though the gain is changed in increments or decrements of 1 dB in the wireless communication devices 1 through 3 according to embodiments 1 through 3 described above, the gain may be increased or decreased by using difference value between ADCOUT and PREF (GD=PREF−ADCOUT) in the wireless communication device 4.

When the difference value GD between ADCOUT and PREF is greater than α dB or less than −β dB ("YES" in step S40), after the difference value GD is found, the gain G is increased by GD dB (step S41). When GD is equal to or smaller than α dB or equal to or greater than −β dB ("NO" in step S40), the present gain G is outputted.

The wireless communication device 4 according to embodiment 4 enables the improvement in the accuracy of the automatic gain control by the increase or decrease in the gain by using the difference value between ADCOUT and PREF.

Though embodiments 1 through 4 have been described above with reference to the drawings, it goes without saying that the disclosure is not limited to such examples. It is obvious that a person skilled in the art can devise various alterations or modifications within the scope as set forth in the claims, and it is to be understood that these alterations and modifications belong, as a matter of course, to the technical scope of the present disclosure.

Numerical values provided for the wireless communication devices 1 through 4 according to embodiments 1 through 4 are only illustrative for the sake of easier understanding of the description on a series of operations and are not meant to limit the contents of the present disclosure in any way.

Though the ADC 21 is used in the power detection unit 22 in the wireless communication devices 1 through 4 according to embodiments 1 through 4, a comparator may be used instead.

Though the gain value calculated from detection result on the transmit level of the present burst signal is used for the transmission gain for the subsequent burst signal in the wireless communication devices 1 through 4 according to embodiments 1 through 4, the gain value may be used as the transmission gain for a plurality of burst signals including the subsequent burst signal and later burst signals.

In the wireless communication devices 1 through 4 according to embodiments 1 through 4, the correction sections are configured between the burst signals in order to make the output level of the burst signals constant and the gain setting is made for the subsequent burst signal.

Alternatively, the correction sections may be each configured so as to extend through a plurality of burst signals and the same gain setting may be made for the plurality of burst signals, after the level is detected.

Though the disclosure has been described with reference to the examples configured by using hardware for the embodiments, the disclosure may be embodied by using software in cooperation with hardware.

The functional blocks used for the description on the embodiments are typically embodied as LSIs that are integrated circuits. The LSIs may separately be provided as single chips or some or all of the LSIs may be integrated on a single chip. Elements referred to as LSIs herein may be referred to as ICs, system LSIs, super LSIs, or ultra LSIs in accordance with degree of integration.

Technique of forming the integrated circuits may be achieved by use of dedicated circuits or general-purpose processors without limitation to LSIs. Field programmable gate arrays (FPGAs) that are programmable after manufacture of the LSIs and/or reconfigurable processors in which connection or setting of circuit cells inside the LSI can be reconfigured may be used.

Furthermore, in a case where a new technology for forming integrated circuits that replace LSIs is developed as a result of progress in semiconductor technology or other technologies derived therefrom, the functional blocks may be integrated by using such technology, as a matter of course. Such possibility may include application of biotechnology.

(Summary of One Aspect of the Disclosure)

The first wireless communication device of the disclosure includes a digital modulation signal generator that generates digital modulation signals, a DAC that converts the digital modulation signals into analog signals, a modulator that generates amplified quadrature modulation signals by exerting quadrature modulation and amplification on the analog signals, an antenna that radiates the amplified quadrature modulation signals, a power detector that outputs power detected signals obtained from power detection of the amplified quadrature modulation signals, a controller that adjusts gain of the modulator by using the power detected signals and a desired power value, a thermometer that measures ambient temperatures at a plurality of burst transmission periods, and a high-power prevention circuit that readjusts the gain of the modulator for a present burst transmission period by using the ambient temperature at a past burst transmission period, the ambient temperature at the present burst transmission period, a predetermined temperature difference threshold, and the adjusted gain of the modulator.

The second wireless communication device of the disclosure is the first wireless communication device in which the high-power prevention circuit decreases the gain of the modulator to a minimum value or a default setting value when the ambient temperature at the present burst transmission period is lower than the ambient temperature at the past burst transmission period by the predetermined temperature difference threshold or greater value.

The third wireless communication device of the disclosure is the second wireless communication device in which the default setting value is a gain determined in the output level control upon start-up.

The fourth wireless communication device of the disclosure is the first wireless communication device in which the modulator includes amplifiers that amplify the analog signals, a quadrature modulator that exerts the quadrature modulation on the amplified analog signals, a high-power amplifier that amplifies the quadrature modulation signals, and a local amplifier that varies a level of local signals to be inputted into the quadrature modulator, in which gain for at least one of the amplifiers, the high-power amplifier, and the local amplifier is capable of being changed and in which the high-power prevention circuit readjusts the gain for at least one of the amplifiers, the high-power amplifier, and the local amplifier each having variable gain.

The fifth wireless communication device of the disclosure is the first wireless communication device in which the controller uses a gain value calculated from a detection result on a transmit level of the present burst transmission period as a transmission gain for a plurality of burst transmission periods including subsequent and later burst transmission period.

The sixth wireless communication device of the disclosure is the first wireless communication device in which the controller adjusts the gain in increment or decrement of 1 dB for each burst transmission period.

The seventh wireless communication device of the disclosure is the first wireless communication device in which the controller adjusts the gain by using a difference value between an output level and the desired power value.

The disclosure is useful for a wireless communication device and the like that use 60 GHz band signifying millimeter wave, for instance.

What is claimed is:

1. A wireless communication device comprising:
   a digital modulation signal generator that generates digital modulation signals;
   a DAC that converts the digital modulation signals into analog signals;
   a modulator that generates amplified quadrature modulation signals by exerting quadrature modulation and amplification on the analog signals;
   an antenna that radiates the amplified quadrature modulation signals;
   a power detector that outputs power detected signals obtained from power detection of the amplified quadrature modulation signals;
   a controller that adjusts gain of the modulator by using the power detected signals and a desired power value;
   a thermometer that measures ambient temperatures at a plurality of burst transmission periods; and
   a high-power prevention circuit that readjusts the gain of the modulator for a present burst transmission period by using the ambient temperature at a past burst transmission period, the ambient temperature at the present burst transmission period, a predetermined temperature difference threshold, and the adjusted gain of the modulator.

2. The wireless communication device according to claim 1,
wherein the high-power prevention circuit decreases the gain of the modulator to a minimum value or a default setting value when the ambient temperature at the present burst transmission period is lower than the ambient temperature at the past burst transmission period by the predetermined temperature difference threshold or greater value.

3. The wireless communication device according to claim 2,
wherein the default setting value is the gain determined in output level control upon start-up.

4. The wireless communication device according to claim 1,
wherein the modulator includes
amplifiers that amplify the analog signals,
a quadrature modulator that exerts the quadrature modulation on the amplified analog signals,
a high-power amplifier that amplifies the quadrature modulation signals, and
a local amplifier that varies a level of local signals to be inputted into the quadrature modulator,
wherein gain for at least one of the amplifiers, the high-power amplifier, and the local amplifier is capable of being changed and
wherein the high-power prevention circuit readjusts the gain for at least one of the amplifiers, the high-power amplifier, and the local amplifier each having variable gain.

5. The wireless communication device according to claim 1,
wherein the controller uses a gain value calculated from a detection result on a transmit level of the present burst transmission period as a transmission gain for a plurality of burst transmission periods including subsequent and later burst transmission period.

6. The wireless communication device according to claim 1,
wherein the controller adjusts the gain in increment or decrement of 1 dB for each burst transmission period.

7. The wireless communication device according to claim 1,
wherein the controller adjusts the gain by using a difference value between an output level and the desired power value.

* * * * *